US008392089B2

(12) United States Patent
Spetler

(10) Patent No.: US 8,392,089 B2
(45) Date of Patent: Mar. 5, 2013

(54) METHOD OF ESTIMATING AN AVAILABLE GRIP MARGIN OF A TIRE WHEN ROLLING

(75) Inventor: Frederic Spetler, Lezoux (FR)

(73) Assignee: Michelin Recherche et Technique S.A., Granges-Paccot (CH)

( * ) Notice: Subject to any disclaimer, the term of this patent is extended or adjusted under 35 U.S.C. 154(b) by 1280 days.

(21) Appl. No.: 12/166,546

(22) Filed: Jul. 2, 2008

(65) Prior Publication Data

US 2009/0012689 A1    Jan. 8, 2009

(30) Foreign Application Priority Data

Jul. 4, 2007 (FR) ..................................... 07 04877

(51) Int. Cl.
*B60T 7/12* (2006.01)
(52) U.S. Cl. ............ 701/82; 701/73; 701/80; 152/152.1; 152/209.4; 152/209.18; 152/209.1; 152/209.8; 340/442; 340/447; 173/146; 173/9
(58) Field of Classification Search .................... 701/73, 701/80, 82, 90; 180/197; 73/9, 105, 146; 152/152.1, 209
See application file for complete search history.

(56) References Cited

U.S. PATENT DOCUMENTS

| 5,513,907 | A | 5/1996 | Kiencke et al. ............... 303/950 |
| 6,473,682 | B1 | 10/2002 | Nakamura ...................... 701/74 |
| 6,549,842 | B1 * | 4/2003 | Hac et al. ........................ 701/80 |
| 6,666,079 | B2 | 12/2003 | Poulbot et al. .................. 73/146 |
| 6,823,912 | B2 * | 11/2004 | Oohigashi .................. 152/209.8 |
| 6,840,098 | B2 * | 1/2005 | Halliday .......................... 73/146 |
| 6,991,013 | B2 | 1/2006 | Poulbot et al. ............. 152/152.1 |
| 7,099,765 | B2 | 8/2006 | Bertrand ......................... 701/73 |
| 7,377,300 | B2 * | 5/2008 | Daval .......................... 152/152.1 |
| 2002/0111752 | A1 | 8/2002 | Nakamura ...................... 702/42 |
| 2003/0074127 | A1 * | 4/2003 | Kin et al. ........................ 701/80 |
| 2005/0155685 | A1 * | 7/2005 | Daval .......................... 152/152.1 |
| 2009/0012689 | A1 * | 1/2009 | Spetler ............................ 701/82 |

FOREIGN PATENT DOCUMENTS

| DE | 101 56 823 A1 | 6/2002 |
| EP | 0 630 786 A1 | 12/1994 |
| EP | 0 891 904 | 1/1999 |
| EP | 1 275 949 A1 | 1/2003 |
| EP | 1 350 640 A1 | 10/2003 |
| EP | 1 719 676 A1 | 11/2006 |
| WO | WO 03/066399 A1 | 8/2003 |
| WO | WO 03/070492 A2 | 8/2003 |

* cited by examiner

*Primary Examiner* — Redhwan K Mawari
(74) *Attorney, Agent, or Firm* — Fitzpatrick, Cella, Harper & Scinto

(57) ABSTRACT

A method of estimating the available grip margin of a tire of a vehicle rolling on a ground involves:
  estimating a quantity $R_{slip\ ca}$, i.e., the ratio of the slip contact area and the total contact area of the tire on the ground;
  determining, in a signal processing unit, the grip potential used $P_{\mu,used}$ and/or the available grip margin of the tire $P_{\mu,avail}$ from the quantity and pre-established data corresponding to the type of the tire, where $P_{\mu,avail}=1-P_{\mu,used}$; and
  recording in a memory the grip potential used and/or the available grip margin of the tire.

15 Claims, 4 Drawing Sheets

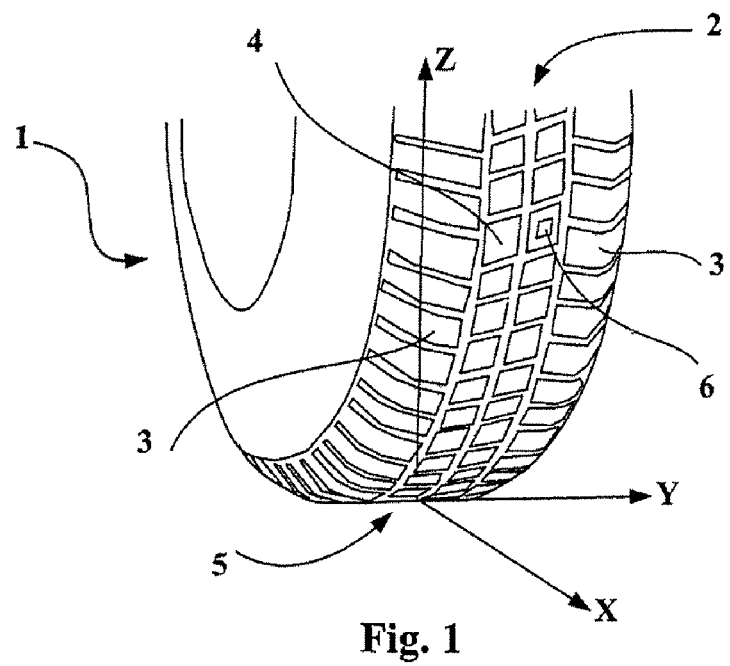
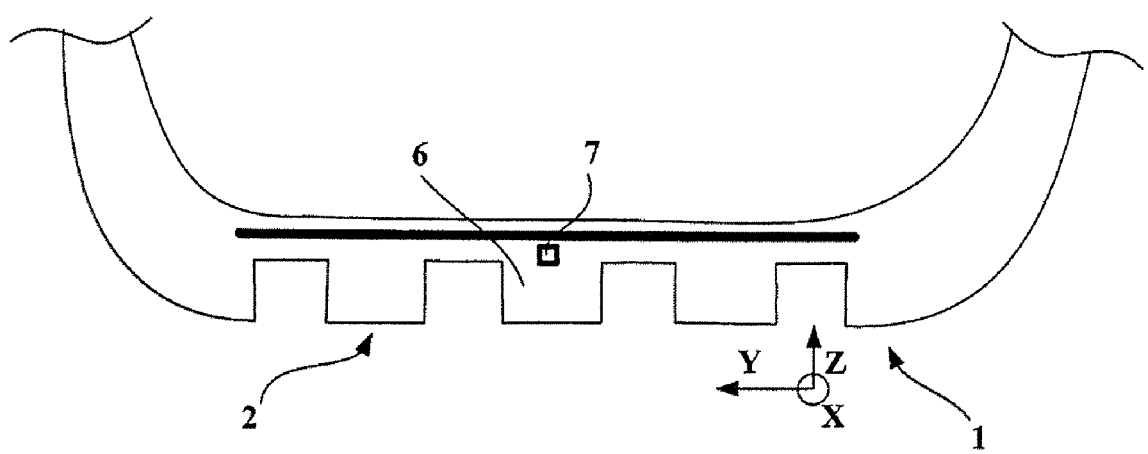

METHOD OF ESTIMATING AN AVAILABLE GRIP MARGIN OF A TIRE WHEN ROLLING

FIELD OF THE INVENTION

The present invention relates to a method of estimating an available grip margin of a tire when the tire is rolling on a surface such as the road or the ground.

BACKGROUND

The available grip margin is a characteristic suitable to inform a driver of the level of use of a potential of his tires and to alert him to the approach of the grip limit.

International Patent Publication No. WO 03/066399 discloses a method of determining the maximum grip coefficient of a tire and the percentage of potential used, including the steps of selecting a plurality of fixed points in space (that is to say, points that are fixed in a reference frame associated with the vehicle being used), which points lie at different azimuths along the circumference in at least a sidewall of the tire, obtaining a corresponding number of measurements of circumferential distance variation (extension or contraction) at these fixed points when the tire is rolling on the ground or the road, and the measurement signals are processed so as to extract the maximum grip coefficient and the percentage of potential used.

This method allows these characteristics to be determined from distance variations measured on the rolling tire. This method requires, however, that there be a slip zone in a contact area of the tire.

SUMMARY OF ASPECTS OF THE INVENTION

One aspect of the present invention is to provide an alternative method of estimating the available grip margin of a tire rolling on a surface such as the ground.

The method according to this aspect is characterized in that it includes:
estimating a quantity $R_{slip\ ca}$, i.e., a ratio of a slip contact area and a total contact area of the tire on the ground;
determining, in a signal processing unit, a grip potential used $P_{\mu,used}$ and/or an available grip margin of the tire $P_{\mu,avail}$ from the ratio and pre-established data connected with a type of the tire, where $P_{\mu,avail}=1-P_{\mu,used}$; and
recording in a memory the grip potential used and/or the available grip margin of the tire.

According to a first mode of implementation, the pre-established data is in the form of an experimental chart representing a change in the grip potential used $P_{\mu,used}$ as a function of measured values of a ratio $R_{slip\ ca}$ for various determined rolling conditions.

According to a second mode of implementation, the pre-established data is in the form of coefficients A, B, and C of an analytic formula F such that:

$$P_{\mu,used}=(R_{slip\ ca}+A)^B+C \text{ if } (R_{slip\ ca}+A)^B+C<1, \text{ and}$$

$$P_{\mu,used}=1 \text{ otherwise,}$$

where A, B, and C are constants dependent on the type of the tire.

The method according to this aspect of the invention is based on a close relationship observed between the global value $P_{\mu,used}$ and the ratio $R_{slip\ ca}$. As soon as the estimated ratio $R_{slip\ ca}$ is at or over 0.1 or 10%, the estimates of the grip potential used and of the available grip margin are very satisfactory.

In a first embodiment, the quantity $R_{slip\ ca}$ may be estimated from a measurement of the speed differential between the wheel of the tire and the ground and from a model of the operation of the tire that connects this speed differential to the quantity $R_{slip\ ca}$.

It is therefore possible, on the basis of a tire model, possibly precalibrated experimentally, to estimate a ratio of a sliding contact area (i.e., a length ratio or an area ratio) from knowledge of a rotation speed of a wheel (for example, data from ABS encoders) and a speed of advance of a vehicle on which the wheel is employed. This model is therefore capable of deducing the sliding contact area proportion or ratio from a calculation that utilizes input variables for overall apparent slip of the entire tire.

In a second embodiment, the tire has a tread pattern block that is equipped with one or more sensors, each for measuring a characteristic quantity of stresses experienced locally by the tread pattern block when the tire is rolling on the ground. The method of estimating the quantity $R_{slip\ ca}$ then includes the following steps:
measuring the characteristic quantity when the tire is rolling on the ground;
generating a signal corresponding to the measurements made;
extracting from this signal a portion relating to a sensor or sensors passing into a contact area of the tire on the ground and determining a total length of the contact area $L_{ca}$;
determining information characterizing an onset of local slip of the tread pattern block from the extracted portion of the signal;
determining a local slip length $L_{slip\ ca}$ of the tread pattern block; and
calculating a ratio $R_{slip\ ca}$ such that $R_{slip\ ca}=R_{slip\ ca}/L_{ca}$.

The measured characteristic quantity, in the plane of the ground, may be a longitudinal stress $s_x$ along a rolling direction of the tire and/or a transverse stress $s_y$ transverse to the rolling direction of the tire, representing a local grip $\mu_{local}$ or $\mu_{local,x}$ or $\mu_{local,y}$ of the tread pattern block.

The measured characteristic quantity may be a ratio of stresses representing the local grip $\mu_{local}$ or $\mu_{local,x}$ or $\mu_{local,y}$ of the tread pattern block and corresponding to a ratio of a measurement of the longitudinal stress $s_x$ and/or the transverse stress $s_y$, with respect to the rolling direction, to a stress $s_z$ normal to an X-axis of the rolling direction.

Another aspect of the invention is directed a device for estimating an available grip margin of a tire of a vehicle travelling over a ground, the device including:
a tire, in which at least one tread pattern block or a measurement zone of a tread of the tire is equipped with one or more sensors, each sensor for measuring stresses experienced locally by the tread pattern block or the measurement zone of the tread of the tire when rolling on the ground;
means for transmitting a signal corresponding to the measurements of the stresses; and
a signal processing unit configured to extract, from the transmitted signal, a signal portion corresponding to a number or a duration of passage of the one or more sensors in a contact area of the tire rolling on the ground, characterized in that the device includes, in the signal processing unit, a program for implementing, on the basis of the extracted signal, a method according to an embodiment of the invention.

BRIEF DESCRIPTION OF THE DRAWINGS

Aspects of the present invention will be more clearly understood upon reading the following description and upon examining the accompany figures. The figures are presented merely by way of example and in no way do they limit the invention.

The figures show:

FIG. 1: a schematic representation of a tire on a road;

FIG. 2: a representation of a sensor in a tread of a tire;

DETAILED DESCRIPTION OF ASPECTS OF THE INVENTION

Figure 3:
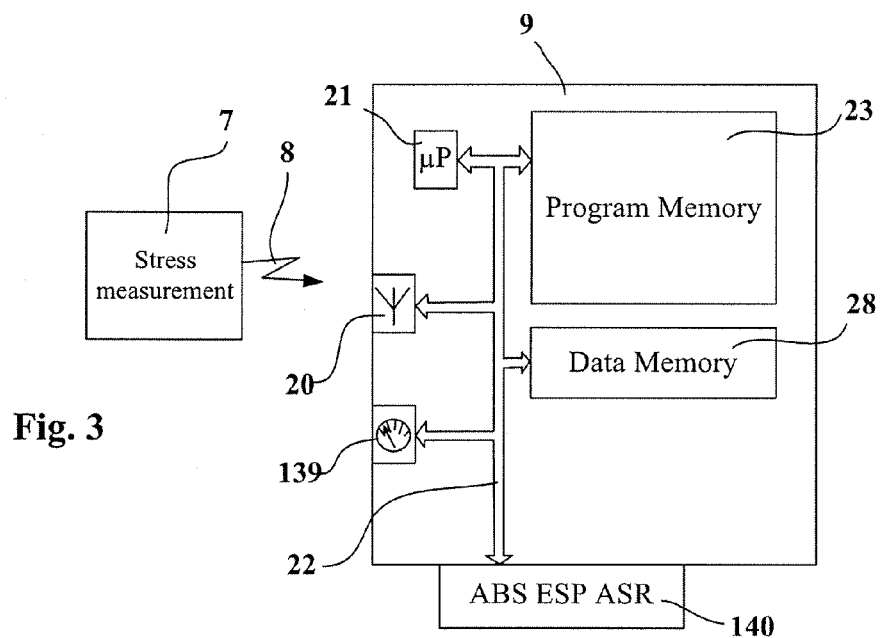
FIG. 3: a representation of a device according to an embodiment of the invention.

FIG. 1 shows a tire 1 provided with a tread 2. The tread 2 has two shoulders 3 and a central part 4. When the tire is moving, the tread 2 comes into contact with a ground 5. This ground 5, which may include a road, is represented by a plane defined by two axes, namely an axis X and an axis Y. The X-axis corresponds to a longitudinal axis along a rolling direction of the tire and the Y-axis corresponds to a transverse axis, transverse to the rolling direction of the tire. Finally, an axis Z is defined to be normal to a plane of the ground (e.g., the road).

FIG. 2 shows a partial axial cross section of the tire 1 (i.e., a cross section passing through a rotation axis of the tire) used by a vehicle (not shown). There is schematically shown a tread pattern block 6, otherwise called an element 6, which includes a sensor 7. In the following description, the pattern block 6 is understood to refer not only to a single well-defined element but also a local zone around which significant stress measurements are recorded by the sensor 7. Thus, these measurements may equally well be carried out in this local zone, for example for a smooth tire having no pattern in relief.

Longitudinal shear stresses $s_x$, transverse shear stresses $s_y$, and compressive stresses $s_z$ are measured, using the sensor 7, in the pattern block 6 along the three axes X, Y, and Z, described above. All of these measurements are carried out for a sensor 7 approximately at the center of a pattern block or a measurement zone. These measurements correspond to local stresses in the block.

The respective sums of all of these local stresses for all of the blocks in contact with the road or ground along an area of contact and for each of the respective axes X, Y, and Z represent, respectively, the overall longitudinal, transverse, and normal stresses and/or forces applied at the center of the tread of the tire.

The present description does not aim to describe the means and the method of measurement of a sensor 7, which may be found in particular in European publication EP 1 275 949 A1. The sensors used in accordance with embodiments of the present invention operate according to various technologies—they may be piezoelectric or piezoresistive gauges or capacitors. Thus, for example, a Hall-effect sensor may be combined with its magnetic element, the whole assembly being embedded in the rubber of the tire. For further details regarding the technologies employed for these sensors, the reader may also refer to U.S. Pat. No. 6,666,079, which gives a description concerning various stress sensors that may be used in the tread of a tire.

Thanks to knowing these local stresses, the local grip $\mu_{local}$ is deduced from them. This grip is calculated in a relatively simplified manner according to the type and number of stresses detected and measured.

Thus, a local grip of the tire along the X-axis is given by:

$$\mu_{local,x} = \sqrt{\frac{s_x^2}{s_z^2}};$$

a local grip along the Y-axis is given by:

$$\mu_{local,y} = \sqrt{\frac{s_y^2}{s_z^2}};$$

and, for more completeness, a grip along the two axes X and Y is given by:

$$\mu_{local} = \sqrt{\frac{s_x^2 + s_y^2}{s_z^2}}.$$

A normal stress $s_z$, sometimes called a compressive stress, is significantly established approximately as soon as an element 6 equipped with its sensor 7 enters the contact area over the ground and continues until it leaves the contact area. This normal stress is approximately constant over the entire time the element 6 is passing through the contact area, as it corresponds very approximately to the contact pressure characteristic of the tire on the ground.

Thus, in a simplified manner, a measurement of $\mu_{local}$ along the X axis may also be considered as being equal to the simple absolute value of $s_x$, ($\mu_{local,x}=|s_x|$) and in the same way $\mu_{local}$ along the Y axis is equal to the absolute value of $s_y$, ($\mu_{local,y}=|s_y|$), and more generally $\mu_{local}=\sqrt{s_x^2+s_y^2}$.

Depending on the local stresses detected by the sensor 7, longitudinal stresses, which correspond to forces for transmitting the traction of the tire, i.e., for braking and acceleration, and forces along the transverse axis Y for guiding the vehicle and involving drift of the tire, are measured.

Throughout the description, the term "stress" should be understood in the broad sense as corresponding to actual elements of stresses or forces or displacements or deformations. The forces and deformations are linked through relationships well known to those skilled in the art.

Within the same spirit, it is immaterial whether the local grip $\mu_{local}$ is established according to any one of the equations described above.

FIG. 3 illustrates a measurement device according to an embodiment of the invention, which includes stress measurement sensors 7 and a transmitter 8 for transmitting a signal produced by the sensors 7 to a signal processing unit 9. The processing unit 9 is preferably placed in a vehicle. As a variant, this processing unit 9 may be placed in a tire of the vehicle. According to this variant, other transmission means are necessary for transmitting the processed signal from the tire to devices on board the vehicle or to a driver of the vehicle.

Moreover, a person skilled in the art will be aware of the various possible forms of transmission means for transmitting a signal between a tire and the vehicle. For this purpose, the reader may refer to European publication EP-A-1 350 640, which in particular illustrates one means in which an antenna is implanted in a tire. This antenna is positioned inside the actual tread of the tire and is connected to a sensor by a cable.

The antenna may be an electric field antenna of a quarter-wave type or else of a power-signal frequency-modulation or amplitude-modulation type. It is worthwhile to point out here that a primary antenna fastened to the vehicle, facing a secondary antenna placed in the tire, also makes it possible, by an inductance effect, to transmit power from the primary antenna, which is connected for example to a battery of the vehicle, to the secondary antenna so as to deliver energy to the sensor. A microbattery inserted with the sensor 7 into a premoulded insert of the tread 2 may also provide this function.

In FIG. 3, a signal corresponding to the stress measurements is transmitted via the transmitter 8 to the processing unit 9, after the signal has been received by an antenna 20.

Moreover, operation of the sensor 7 is preferably controlled by an electronic measurement circuit of an ASIC (application specific integrated circuit) type for encoding measurements made by the sensor 7, all before transmission of the measurements constituting the signal to be analysed. The antenna 20 is connected to a microprocessor 21 of the processing unit 9 via an internal junction bus 22 for data, addresses, and commands.

The processing unit 9, connected to the bus 22, includes a program memory 23. A program stored in this program memory 23 makes it possible, according to various program sections, to process an extracted signal until an available overall grip potential $P_{\mu,avail}$ has been calculated. It also includes a data memory 28 intended to receive and store in memory specific tire data for the device.

Figure 4:
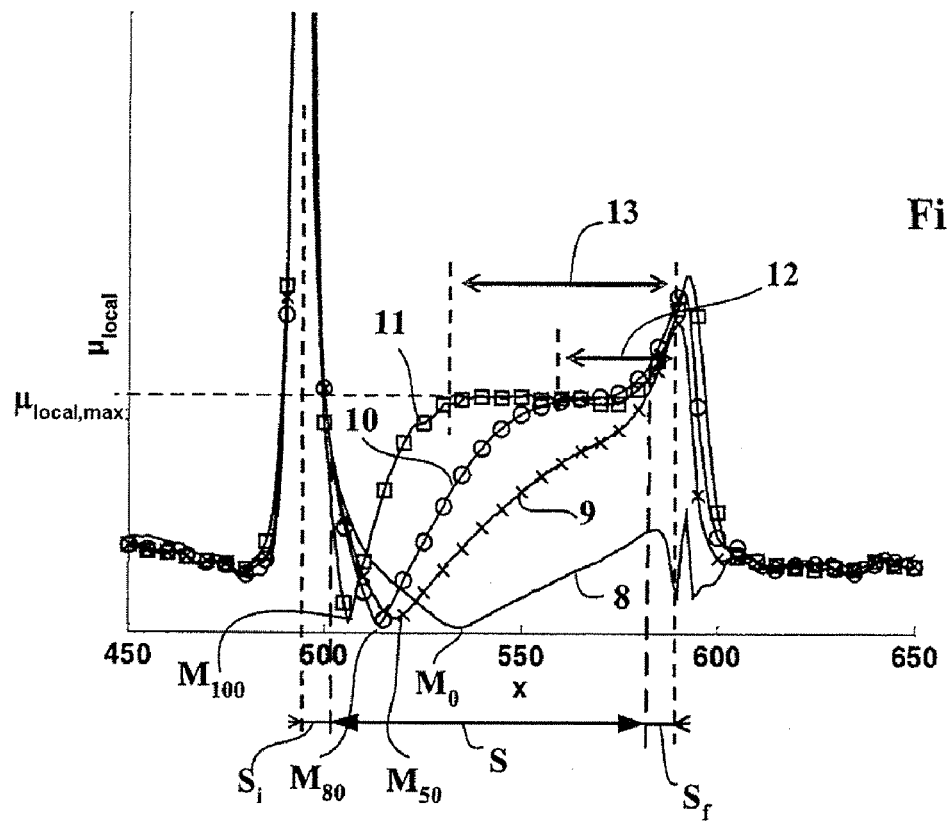
FIGS. 4 and 5: curves with a local grip deduced from measurements taken in a measurement block present in a contact area for a tire rolling freely and for various braking torques, plotted on the Y-axis as a function of a longitudinal measurement position in the contact area plotted on the X-axis.

Thus, FIG. 4 is a plot of measurements of local grip $\mu_{local}$ in a pattern block, as ordinates, determined using both transverse and longitudinal stresses. The local grip $\mu_{local}$ is a non-dimensional quantity and therefore expressed in the form of a simple coefficient. In addition, in FIG. 4, a dimension is not explicitly given as only its variation is of interest to us. As abscissae, the obtained curve is studied according to the number of measurements taken during one revolution of the tire: in this case, 1024 measurements are taken along the linear deployment of a complete circumference corresponding to one revolution of the tire. For all this, significant sensor measurements are detected between a measurement index of 480 (i.e., measurement number 480) and a measurement index of about 600 (i.e., measurement number 600). Thus, this amounts to measurements of about one hundred sensors of the 1024 deployed linearly along a circumference experiencing significant stresses at a given time.

This curve is also obtained by employing one and the same sensor experiencing significant stresses taken at a given frequency, at regular time intervals. Thus, by knowing the speed of the vehicle during these measurements, the variation of $\mu_{local}$ along the length of the deployed contact area may be deduced therefrom in the same way.

Experimental measurements were carried out on a Michelin 195 65 R15 XH1 Energy tire with a load of 400 decanewtons and with an inflation pressure of 2 bar. The four curves 8, 9, 10, and 11 of FIG. 4, indicated as the solid line, by the crosses, by the circles, and by the squares, respectively, are taken for respective braking torques of zero, 50 daNm (decanewton·meter), 80 daNm, and finally 100 daNm.

Curve 8, with no braking torque, corresponds to free rolling for which a signal is properly detected between measurement point 500 and measurement point 590, approximately. The shape of the signal obtained before measurement point 500 is not significant, as it corresponds to the moment when the sensor enters the contact area, or when the denominator corresponding to the normal stress along the Z axis is zero or virtually zero. In the same way, erratic signals or signal measurements obtained after measurement point 590 correspond to the sensor leaving the contact area until measurement point 600, approximately, after which the signal corresponds to no significant stress. Between measurement points 590 and 600, approximately, the signal obtained may be contaminated by various physical effects, especially the passage, again, through a zero normal stress, and by an elastic expansion effect of the pattern blocks held against the ground. Thus, the representative contact area corresponding to significant stress measurements will be between, approximately, measurement point 500 and measurement point 590, i.e., a significant signal from which, at each end, two parts are removed, at a signal start ($S_i$) and a signal finish ($S_f$), respectively, representing 5 to 10% of the total signal. It may therefore be considered overall that the contact area is sampled with about 70 to 75 measurement points. It is specifically this remaining signal, represented by a portion (S) lying between the parts ($S_i$) and ($S_f$), which is analyzed.

The first part of curve 8 is located before a point $M_0$ corresponding to measurement index 535. In this part, a block located in the contact area is pulled forwards and the tire, although rolling freely, locally experiences on the ground a non-zero grip, the point of passage of the sensor approximately plumb with a hub of the tire being located at the point $M_0$ where the grip experienced is virtually zero. The second part, located between measurement point 535 and measurement point 590 corresponds to a part where the tire generates locally, at each measurement point, a negative stress corresponding to an element pulled rearwards, in the opposite direction to that in which the tire rolls. The point $M_0$ does not lie, however, at the center of the contact area as defined, but slightly upstream of the center. This is explained, according to the measurement location, by different force distributions over the width of the contact area.

On curve 9, when a braking torque of 50 daNm is applied, the signal obtained has a first part located before a point $M_{50}$, the point at which the local grip used is least and at which the block/sensor is virtually undeformed in shear, substantially identical to the first part of curve 8. However, this first part has a steeper downward slope. The tire retains positive traction before the contact area but this is smaller and drawn towards the front. The stress in the direction of the rolling axis of the tire is lower owing to the slowing action caused by the braking torque. The moment when the sensor passes into the point of lower shear of the block occurs earlier and is located at around measurement index 525.

The second part of curve 9 also indicates an absolute value of the negative stresses directed in an opposite direction to the rolling direction, which stresses pull the local pattern block rearwards, in the opposite direction to the rolling direction, more strongly than in the case of free rolling. The second part located after point $M_{50}$ has a much steeper slope, but one that increases uniformly up to the point where the sensor leaves the contact area. This second part corresponds to a local braking shear in the block of the contact area, this local shear being in the form of a progressive deformation of the block, which therefore transmits the braking torque to the tire in contact with the ground. The slope of this second part of curve 9 indicates that this local braking shear takes place uniformly and progressively until the sensor leaves the contact area; no saturation or slip effect is detected.

The braking effect, above a certain intensity, may include a slight, and at least local, slip of the tire relative to the ground.

This local braking slip therefore increases with the braking force up to the shoulder of curve 9. The shoulder occurs when, at least locally, the tire or one or more of its blocks, slides without generating more additional force. Saturation corresponds to this limiting local braking force.

In curves 10 and 11, corresponding to braking torques of 80 and 100 daNm, respectively, their first parts are shifted according to the tendency described above, with points $M_{80}$ and $M_{100}$ placed earlier and earlier along the contact area. Their second parts, located after points $M_{80}$ and $M_{100}$, possess increasingly positive slopes. However, curve 10 shows that, at about measurement index 560, there is stagnation of the grip $\mu_{local}$ for measurements taken along the contact area.

From this measurement index 560 up to a point where the block leaves the contact area, this measurement (i.e., the grip $\mu_{local}$) is practically constant or is indeed constant: the curve exhibits a plateau as the deformation of the block is a maximum and can no longer follow the variation imposed on it by the increase in braking torque. This constant part 12 for which the local grip stagnates therefore indicates local slipping of the block.

The same applies to a part 13, starting from about measurement index 530 on curve 11 up to again the point where the block leaves the contact area. This part 13 also corresponds to local slipping of the block.

Thus, for both of these parts, 12 and 13, respectively, of curves 10 and 11, as soon as the onset of these plateaus and stagnation of the local grip occur, the block can no longer absorb, through its simple rigidity, the decelerating effect of the braking torque. Simplistically, the block no longer contacts the ground only by deforming, but, owing to a maximum deformation, the block slips in addition along this contact zone or area.

For the experimental measurements carried out according to the parameters described above, the deformation stress remains a maximum and virtually constant over the entire duration of the local slipping. However, it may be appreciated that, depending on the ground condition such as road pavement, in particular on its asperities, during this slipping the block undergoes oscillations due to the fact that, during local slipping, the block suddenly relaxes, freed for example by a particular relief on the ground or road, and therefore undergoes a negative stress smaller than that at the onset of slipping. Then, on resuming contact, the block again undergoes a higher stress, all this thus resulting in oscillations in the value of the saturated grip $\mu_{local}$.

A person skilled in the art knows how to detect a plateau on a curve corresponding to a signal, empirically on the basis of a comparison of two successive measurements, but this does not constitute the sole means of detecting the onset of local slipping of a block in the contact area.

An aspect of the present invention identifies other criteria for reliably detecting a point of onset of local slipping. Thus, a part of a curve for which a variation in local grip is relatively small is detected.

It may in fact be considered that, before local slipping, the pattern block approaches the maximum deformation that it is permitted as a function of the applied stress. Consequently, upon approaching this point, the curve of the local grip varies very slightly. This is therefore specifically measured by the detection, for several consecutive measurement points, of a very small variation in the values of this same curve. The first derivative with respect to the variable x, $$\left(\frac{d\mu_{local}}{dx}\right),$$

corresponding to measurements recorded along the contact area, is then calculated. In order for local slipping to be detected, it is therefore sufficient for this calculation, for a number of consecutive points, to result in a value smaller than a constant S1, $$\left(\frac{d\mu_{local}}{dx} < S1\right).$$

The number of points corresponds approximately to a number equivalent to 10% of the number of measurement points on a contact area. In the example given, over 75 measurement points are extracted from the signal in the contact area, thus this first derivative is calculated for seven consecutive measurements points. The constant S1 corresponds to a constant that is dependent not only on the tire but also on the measurement block in question, according to whether it is, for example, on the central tread or on the shoulder of the tire.

As an illustration, in the example shown in FIG. 4, this represents a coefficient of 0.02, i.e. a variation in $\mu_{local}$ of 0.14, over seven sampling points or seven measurement points. According to this first criterion, referring to curve 9 of FIG. 4, no slippage phase would therefore be detected in this way since the variation in local grip occurs with a difference greater than that given above. In contrast, in particular for curves 10 and 11, the respective plateaus 12 and 13 may be detected using this first criterion from about measurement indices 560 and 530 respectively, thanks to the extremely small variation in the local grip that marks the onset of local slipping of the block.

A second criterion may also be established for detecting local slipping, which consists no longer in determining a small variation in the local grip values over a given number of measurement points, but in determining a sudden change in the slope of the variation in this grip.

The region of interest is therefore in a part of the curve that lies between the part where $\mu_{local}$ varies with a slope greater than the constant S1 given above and the part of the curve where the variation is very slight, mainly the plateau. Where these two parts join, the slope changes relatively suddenly. It is therefore advantageous to detect this part of the curve prior to the onset of a low slope, or even a plateau, and consequently the onset of local slipping.

The absolute value of the second derivative with respect to the variable x corresponding to the measurements recorded along the area of contact makes it possible to calculate a value that, if it is greater than a constant S2, $$\left(\frac{d^2\mu_{local}}{dx^2} > S2\right),$$

results in the determination of a local slip onset point. The constant S2 also depends on the tire and on the block in which the measurements are made, but also on the type of sensor that takes the measurement. For the experimental measurements carried out, this parameter S2 is around 0.007.

Figure 5:
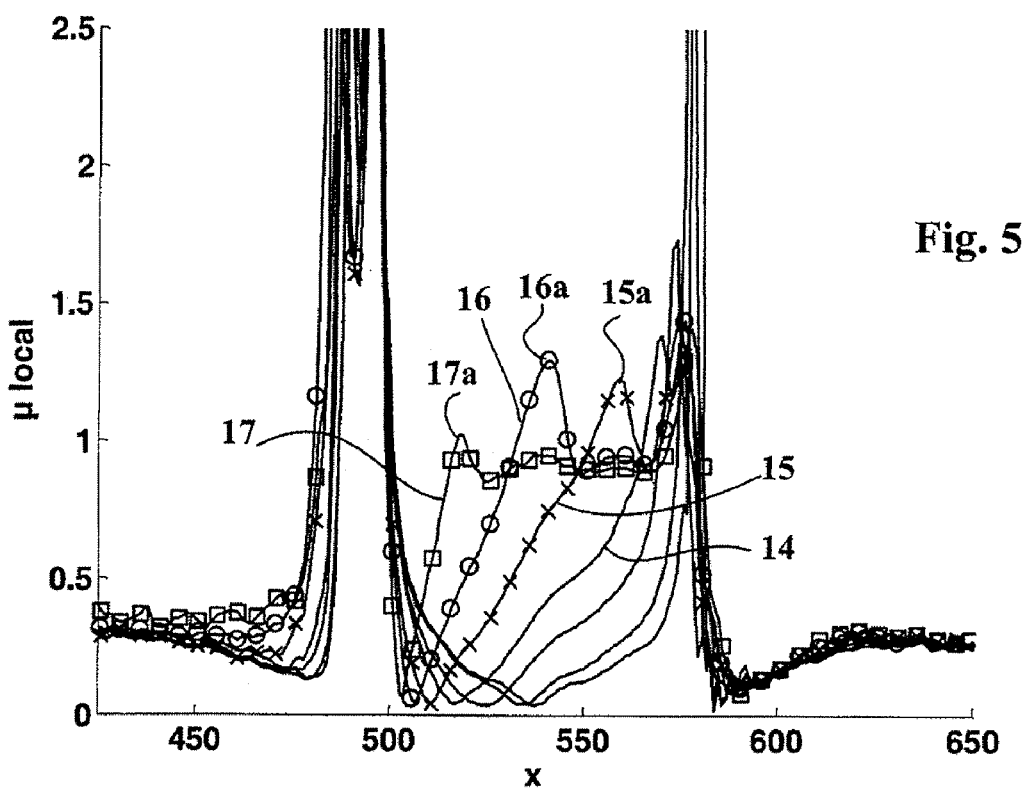

FIG. 5 shows curves substantially similar to those in FIG. 4, for a ground somewhat different and for curves 14, 15, 16, and 17, respectively, corresponding to a tire that experiences braking torques of 50, 75, 100, and 115 daNm, respectively.

Curves 15, 16, and 17 show the appearance of an increasingly large plateau. They also show a sudden change in slope upon the passage of a peak preceding this plateau. Thus, the two first criteria for the detection of a local slip onset point are verified.

It has been shown experimentally that, upstream of the plateau itself, the local grip passes through a maximum in the form of a peak, especially at points 15a, 16a, and 17a. At the top of these peaks, before the plateau corresponding to local slipping, the $\mu_{local}$ has its maximum value, which corresponds to the onset of slipping of the pattern block. However, this maximum $\mu_{local,max}$ does not automatically exist before local slipping of the block, as for example in the case of curves 10 and 11 where local slipping exists and is detected, but where no maximum $\mu_{local,max}$ is visible. This local maximum, which is easily detectable and identifiable by a person skilled in the art, can therefore be used as additional but non-crucial criterion employed as a complement to one or both of the two criteria described above for the purpose of improving the robustness of the detection.

The signal curves studied according to the criteria described above may be subjected beforehand to a polynomial smoothing program, known to those skilled in the art, so as to erase possible parasitic oscillations due to vibrations or to mechanical interference in the contact of the tire with the ground. It has been found experimentally from measurements that, from the moment local slipping for a block 6 in the contact area is observed, slipping continues until the same block leaves the contact area.

Figure 6:
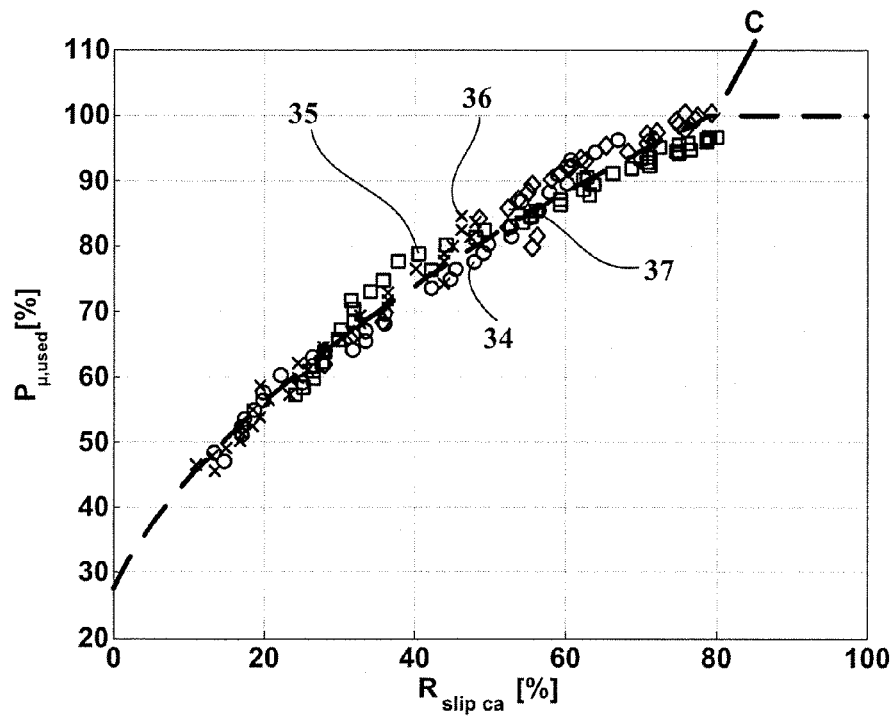
FIG. 6: a curve of a grip potential used, plotted on the Y-axis and as a percentage, as a function of a ratio $R_{slip\ ca}$ representative of a slip in a contact area plotted on the X-axis.

FIG. 6 shows a set of curves obtained experimentally for connecting a local quantity, namely the percentage slipping contact area ($R_{slip\ ca}$), and an overall quantity, i.e., the grip potential used $P_{\mu,used}$. The percentage slipping contact area is determined from the force measurements carried out by means of the sensor or sensors 7 of the device 3, and the grip potential used is determined from the force measurements at the centre of the wheel. These curves are obtained under varied experimental conditions.

The grip potential used $P_{\mu,used}$ is calculated as the ratio of the grip μ at the moment of measurement to the known maximum grip $\mu_{max}$ forming a first experimental measurement. The type of grip μ measured experimentally and used in the calculation is thus that defined above in its overall form, so $P_{\mu,used}$ clearly represents an overall quantity of the tire.

The processing of the local data delivered by the sensor or sensors 7 is as follows: it starts with the total contact area length $L_{ca}$ being determined. This corresponds to the linear deployment of the number of sensors in the contact area or to the time, for a sensor, during which a stress signal corresponding to stress along the normal axis Z is measured and is above a threshold corresponding to a significant stress.

Next, a curve representing the variation in local grip $\mu_{local}$ as a function of the position on the longitudinal axis X of an element or block 6 present in the contact area is generated, and the point of onset of local slipping of the measurement block 6 with the saturation point of the curve of $\mu_{local}$ as a function of X is identified and from this the slip length of the element 6 in the contact area, $L_{slip\ ca}$, is deduced. In practice, the determination of this quantity $L_{slip\ ca}$ is carried out by measuring the length of a plateau consisting of constant, non-changing, successive measurements of the local grip in the contact area.

Then, on the basis of these two quantities $L_{ca}$ and $L_{slip\ ca}$, a ratio $R_{slip\ ca}$ defining the length of the slipping contact area $L_{slip\ ca}$ to the total length of the contact area $L_{ca}$ is calculated.

This ratio $R_{slip\ ca}$ indicates the percentage slipping contact area and represents a local quantity.

Thus, curves 34, 35, 36, and 37 in FIG. 6 show the variation of the grip potential used $P_{\mu,used}$ as a function of the ratio $R_{slip\ ca}$ under various rolling conditions. This ratio, the values of which lie between 0 and 1, is therefore expressed in the form of a percentage between 0% and 100%.

According to aspects of the invention, a close correlation is observed on the curves obtained between the overall parameter $P_{\mu,used}$ and the ratio $R_{slip\ ca}$. Curves 34, 35, 36, and 37, shown by circles, squares, crosses and diamonds, respectively, correspond to braking on dry ground, braking on wet ground, drift on dry ground, and drift on wet ground, respectively.

These curves show that a grip potential used $P_{\mu,used}$ lying between the 30% minimum and the maximum at about 45% should be expected before the occurrence of a slipping contact area. This occurrence is appreciable only when the ratio $R_{slip\ ca}$ is 10%, i.e., 10% of the slipping contact area occurs.

Thus, before the slightest local slipping effect, 30% to 45% of the available grip of the tire can be exploited. This result is due to the deformation of each element accompanying a braking action.

When the grip potential used $P_{\mu,used}$ is a maximum, the grip used corresponds to the maximum grip reached at a point C for a slipping contact area percentage on the X-axis of 80%. In practice, beyond this point, break-away occurs very quickly and the grip of the tire decreases and there is a risk of the tire skidding or the wheel locking depending on whether acceleration or braking is occurring. More generally, beyond this point the loss of grip may result in loss of control of the vehicle.

In practice, assistance devices are designed to intervene according to a ratio of difference in speed between the vehicle and a wheel of the order of 10%, corresponding to a standard tire. Now, depending on the type of tire fitted on the vehicle, this intervention may occur at a moment corresponding to 75% or even 50% of the available grip potential; the tire is therefore not always used to the maximum or close to the maximum of its performance.

According to aspects of the invention, the relationship established between $P_{\mu,used}$ and $R_{slip\ ca}$ makes it possible, from an $R_{slip\ ca}$ value measured on the tire, to deduce the value of the grip margin used or the value complementary to 100%, namely the available grip margin. In addition, the information thus gathered is in practice that coming directly from a physical quantity of the tire in contact with the ground over a few milliseconds. It does not depend on an interpretation, such as a speed difference for which a device of the ABS, ASR, or ESP types work to a tenth of a second, after regulation over about ten wheel revolutions.

An empirical equation is deduced from the experimental curves obtained, such that:

$$P_{\mu(used)}=(R_{slip\ ca}+A)^B+C \text{ if } (R_{slip\ ca}+A)^B+C<1 \text{ and}$$

$$P_{\mu(used)}=1 \text{ otherwise,}$$

where A, B, and C are constants dependent on the type of the tire. In the case of the curves shown in FIG. 6, obtained with a Michelin Energy 195/65R1XH1 tire, these constants are equal to 0.0435, 0.522, and 0.0796, respectively, and vary only very slightly with tire wear.

Figure 7:
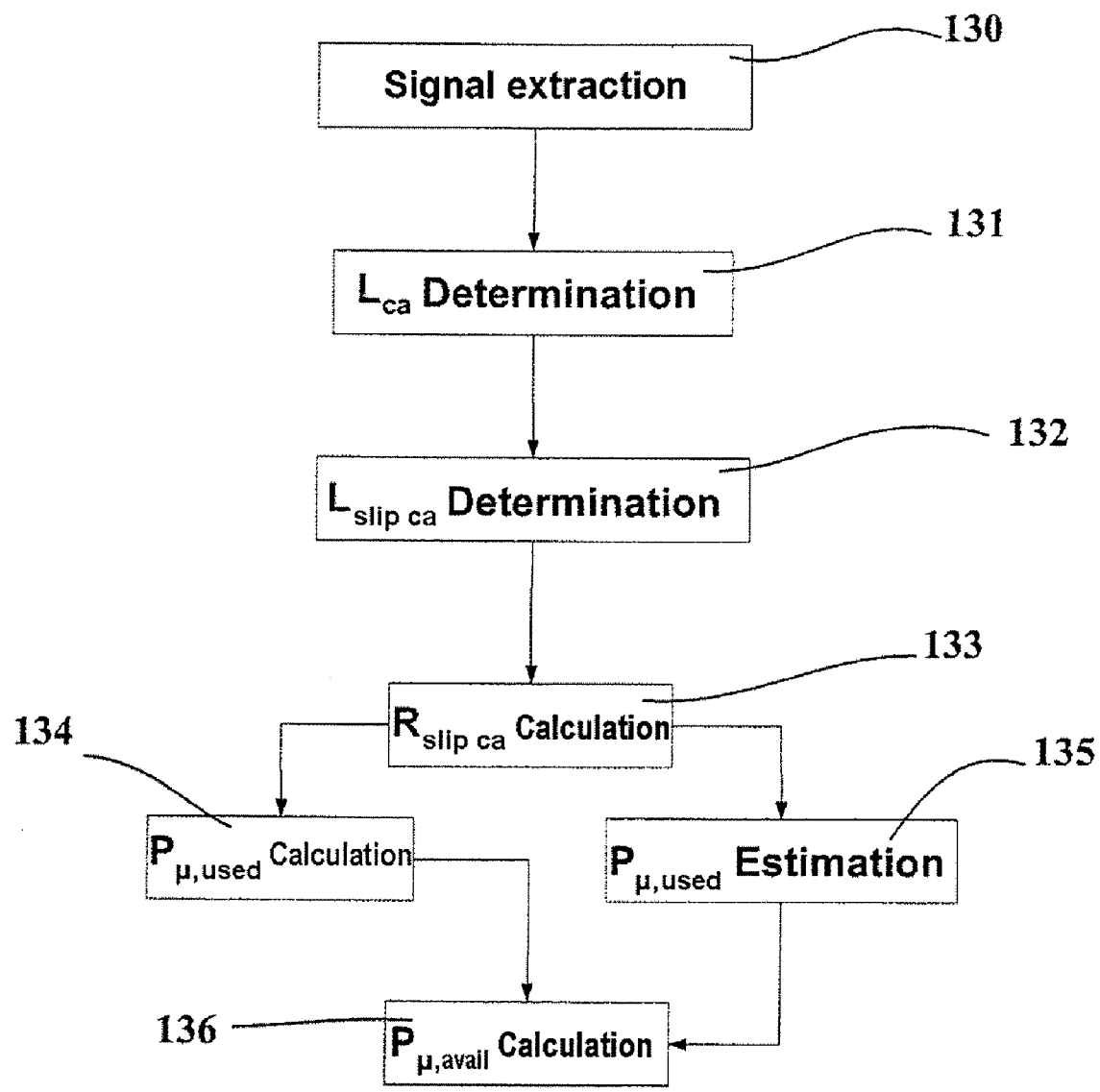
FIG. 7: a schematic block diagram of steps of a method according to an embodiment of the invention.

FIG. 7 shows schematically the steps of a data processing procedure incorporated into the program memory 23 of the device according to aspects of the invention.

The first processing step 130 corresponds to the extraction of the signals from the sensors 7 in the contact area of the tire.

This part of the signal received from the sensors 7 corresponds to a substantially non-zero stress signal, for example typically above a threshold, as described above.

The signal can therefore be extracted according to two criteria.

A first criterion consists in counting the number of sensors indicating a significant stress signal above a threshold, making it possible to conclude that the sensors are present in the contact area on the ground.

A second criterion consists in measuring the time during which a sensor emits a significant stress measurement signal, this time therefore corresponding to that of the sensor passing through the contact area.

To give an example in the case of longitudinal stresses, all the signals corresponding to a stress measurement whose absolute value is above one thousandth of a volt are determined.

Thanks to one or the other of these two criteria, since the number of sensors deployed linearly along the circumference of the tread is known, as is also the speed of the tire, then, in step 131, the total length of the contact area $L_{ca}$ can be calculated for the first and second criteria, respectively. This length may for example be quantified by a number of measurements.

Almost simultaneously, in step 132, the length of the slipping contact area is determined in real time, by determining the point of local slip onset, as described above for obtaining the curves shown in FIG. 6. This determination essentially consists in taking into account the point of local slip onset of the contact area and the point of exit therefrom for a given sensor. Between these two points, the length of the slipping contact area $L_{slip\ ca}$ is obtained. A computer program 133 then determines the slipping contact area ratio $R_{slip\ ca}$ by dividing the value obtained in step 132 by that obtained in step 131.

The processing device 9 also includes a data memory 28. This data memory 28 may include tables of correlations of grip potentials used $P_{\mu,used}$ as a function of various slipping contact area ratios $R_{slip\ ca}$ and for various dynamic rolling conditions. These tables are obtained experimentally, tire type by tire type using the method described above. Next, in step 134, the value of $P_{\mu,used}$ corresponding to the value of $R_{slip\ ca}$ can be determined by interpolation.

More simply, the data memory 28 may contain only the constants A, B, and C of the tire as determined beforehand on the basis of the results explained above (see FIG. 6). The calculation of the grip potential used $P_{\mu,used}$ is then very easily performed in step 135 on the basis of the values of the ratio $R_{slip\ ca}$.

The constants A, B, and C, which are dependent on the type of the tire studied, may be selected via the bus 22, once the type of the tire that has been fitted onto the vehicle is known. It is possible to use either $P_{\mu,avail}$ or $P_{\mu,used}$.

Once the available grip margin $P_{\mu,avail}$ has been calculated, this may be displayed, via the link bus 22, on a display 139 placed inside the actual vehicle. The display 139 is for example on a dial rapidly displaying easily interpretable data. It is basically up to the driver to take account of the information, and consequently to regulate his speed and adapt his type of driving accordingly. Alternatively or additionally, the available grip margin $P_{\mu,avail}$ may be communicated to the various active safety devices 140, such as wheel anti-lock (ABS), trajectory correction (ESP), and anti-slip (ASR) devices.

These devices 140 take into account, depending on the various speeds, the behaviour of the tire on the ground. It is therefore advantageous for these devices to incorporate a physical criterion that takes into account the available grip margin $P_{\mu,avail}$. They therefore have actual data and a direct estimate of $P_{\mu,avail}$ for better calibrated intervention at a point closest to the maximum available grip of the tire.

The invention is not limited to the examples described and shown, while various modifications may be provided thereto without departing from its scope defined by the appended claims.

What is claimed is:

1. A method of estimating an available grip margin of a tire of a vehicle rolling on a ground, a tread pattern block of the tire being equipped with one or more sensors each for measuring a characteristic quantity of stresses experienced locally by the tread pattern block when the tire is rolling on the ground, the method comprising steps of:
   estimating a quantity $R_{slip\ ca}$ corresponding to a ratio of a slip contact area and a total contact area of the tire on the ground by:
   measuring the characteristic quantity when the tire is rolling on the ground,
   generating a signal corresponding to measurements made of the characteristic quantity,
   extracting, using a signal processor, from the generated signal a portion (S) relating to the one or more sensors passing into the contact area of the tire on the ground and determining a total length of the contact area $L_{ca}$,
   determining information characterizing an onset of local slip of the tread pattern block from the extracted portion of the signal,
   determining a local slip length $L_{slip\ ca}$ of the tread pattern block, and
   calculating the quantity $R_{slip\ ca}$ such that $R_{slip\ ca} = L_{slip\ ca}/L_{ca}$;
   determining, in a signal processor, at least one of: a grip potential used $P_{\mu,used}$ and an available grip margin of the tire $P_{\mu,avail}$ from the quantity and pre-established data corresponding to a type of the tire, where $P_{\mu,avail} = 1 - P_{\mu,used}$; and
   recording in a memory at least one of: the grip potential used and the available grip margin of the tire.

2. A method according to claim 1, wherein the pre-established data includes an experimental chart representing a change in the grip potential used $P_{\mu,used}$ as a function of measured values of the ratio $R_{slip\ ca}$ for various determined rolling conditions.

3. A method according to claim 1, wherein the pre-established data includes coefficients A, B, and C of an analytic formula F, such that:

$$P_{\mu,used} = (R_{slip\ ca} + A)^B + C \text{ if } (R_{slip\ ca} + A)^B + C < 1, \text{ and}$$

$$P_{\mu,used} = 1 \text{ otherwise,}$$

where A, B, and C are constants dependent on the type of the tire.

4. A method according to claim 1, wherein the measured characteristic quantity, in a plane of the ground, is at least one of: a longitudinal stress $s_x$ along a rolling direction of the tire and a transverse stress $s_y$ transverse to the rolling direction of the tire, representing a local grip $\mu_{local}$ or $\mu_{local,x}$ or $\mu_{local,y}$ of the tread pattern block.

5. A method according to claim 1, wherein the measured characteristic quantity is a ratio of stresses representing a local grip $\mu_{local}$ or $\mu_{local,x}$ or $\mu_{local,y}$ of the tread pattern block and corresponds to a ratio of a measurement of one of a longitudinal stress $s_x$ and a transverse stress $s_y$, with respect to a rolling direction, to a stress $s_z$ normal to an X-axis of the rolling direction.

6. A method according to claim 1, wherein the extracted portion (S) of the signal represents stress values, as ordinates, as a function, as abscissae, of a time during which a given sensor passes into the contact area or represents stress values, as ordinates, as a function, as abscissae, of a longitudinal position x, along a longitudinal axis corresponding to a rolling direction, of a location of several sensors present along the contact area.

7. A method according to claim 1, wherein a first part ($S_i$) of the extracted portion (S) of the signal is removed therefrom as soon as the tread pattern block enters the contact area and a second part ($S_f$) is removed therefrom just before exit of the tread pattern block from the contact area is detected.

8. A method according to claim 7, wherein each of the removed parts corresponds to about 7.5% of the extracted portion (S) of the signal.

9. A method according to claim 1, wherein a local slip onset information is determined by detecting a constant level of the extracted portion (S) of the signal at an approximately horizontal plateau on a curve representing the extracted portion (S) of the signal.

10. A method according to claim 1, wherein a local slip onset point is determined when a first derivative of a local grip $\mu_{local}$ with respect to a variable x is below a value S1 for n consecutive measurement points recorded along the contact area, where:
 x represents a longitudinal position along a longitudinal axis corresponding to a rolling direction of the tire with the tread pattern block; and
 S1 and n are constant functions of the tire and the tread pattern block.

11. A method according to claim 1, wherein a local slip onset point is determined when an absolute value of a second derivative of a local grip $\mu_{local}$ with respect to a variable x is above a value S2, where:
 x represents a longitudinal position along an longitudinal axis corresponding to a rolling direction of the tire with the tread pattern block; and
 S2 is a constant function of the tire, the tread pattern block, and the sensor.

12. A method according to claim 10, wherein a local slip onset point is determined when, in addition to a first criterion for determining the local slip onset point, the local grip $\mu_{local}$ passes through a maximum $\mu_{local, max}$.

13. A method according to claim 1, wherein an estimate of the available grip margin $P_{\mu, avail}$ is transmitted to one or more active safety devices on board the vehicle.

14. A method according to claim 1, wherein an estimate of the available grip margin $P_{\mu, avail}$ is transmitted to a driver of the vehicle.

15. A device for estimating an available grip margin of a tire of a vehicle travelling over a ground, the device comprising:
 a tire, wherein at least one tread pattern block of the tire or a measurement zone of a tread of the tire is equipped with one or more sensors, each for measuring stresses experienced locally by the tread pattern block or the measurement zone of the tread of the tire when rolling on the ground;
 means for transmitting a signal corresponding to measurements of stresses by the one or more sensors; and
 a signal processor configured to extract, from the transmitted signal, a signal portion corresponding to a number or to a duration of passage of the one or more sensors in a contact area of the tire rolling on the ground;
wherein the processor is equipped with a program that estimates a quantity $R_{slip\ ca}$ by:
 utilizing a signal generated in accordance with measurements made by the one or more sensors of a characteristic quantity of stresses when the tire is rolling on the ground;
 extracting from the generated signal a portion (S) relating to the one or more sensors passing into the contact area of the tire on the ground and determining a total length of the contact area $L_{ca}$;
 determining information characterizing an onset of local slip of the tread pattern block from the extracted portion of the signal;
 determining a local slip length $L_{slip\ ca}$ of the tread pattern block; and
 calculating the quantity $R_{slip\ ca}$ such that $R_{slip\ ca} = L_{slip\ ca}/L_{ca}$.

* * * * *